(12) United States Patent
Choi et al.

(10) Patent No.: US 10,224,345 B2
(45) Date of Patent: Mar. 5, 2019

(54) DISPLAY APPARATUS

(71) Applicant: SAMSUNG DISPLAY CO., LTD., Yongin-si, Gyeonggi-Do (KR)

(72) Inventors: Deok-Young Choi, Suwon-si (KR); So-Hyun Lee, Hwaseong-si (KR); Young-Jin Cho, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 31 days.

(21) Appl. No.: 15/407,899

(22) Filed: Jan. 17, 2017

(65) Prior Publication Data

US 2017/0358603 A1 Dec. 14, 2017

(30) Foreign Application Priority Data

Jun. 8, 2016 (KR) .................... 10-2016-0071308

(51) Int. Cl.
*H01L 27/12* (2006.01)
*G09G 3/3258* (2016.01)
*G09G 3/3275* (2016.01)
*H01L 27/32* (2006.01)

(52) U.S. Cl.
CPC ......... *H01L 27/124* (2013.01); *G09G 3/3258* (2013.01); *G09G 3/3275* (2013.01); *H01L 27/3276* (2013.01); *H01L 27/3297* (2013.01)

(58) Field of Classification Search
CPC ............... H01L 27/124; H01L 27/3276; H01L 27/3297
See application file for complete search history.

(56) References Cited

U.S. PATENT DOCUMENTS 9,893,139 B2   2/2018  Kim et al.
2003/0214500 A1  11/2003  Ishii et al.
(Continued)

FOREIGN PATENT DOCUMENTS

EP       3226300       10/2017
KR    1020080053781    6/2008
(Continued)

OTHER PUBLICATIONS

European Search Report dated Oct. 18, 2017 in corresponding European Patent Application No. 17174637.3.
(Continued)

*Primary Examiner* — Matthew L Reames
(74) *Attorney, Agent, or Firm* — F. Chau & Associates, LLC (57) ABSTRACT

A display apparatus includes at least one pixel in a display area, a driving circuit disposed in a peripheral area adjacent the display area, the peripheral area including a first fan-out area and a second fan-out area disposed between the first fan-out area and the display area, a first fan-out line disposed in the first fan-out area and the second fan-out area, and fanned out from the first fan-out area to the display area, a second fan-out line disposed in the second fan-out area, and fanned out from the second fan-out area to the display area, a first horizontal power line disposed in the second fan-out area, and a second horizontal power line disposed in the first fan-out area, and electrically connected to the second fan-out line.

20 Claims, 8 Drawing Sheets

(56) References Cited

U.S. PATENT DOCUMENTS

| 2011/0090445 A1* | 4/2011 | Kim ..................... G02F 1/1339 |
| | | 349/139 |
| 2013/0106817 A1 | 5/2013 | Gang et al. |
| 2014/0353632 A1 | 12/2014 | Park et al. |
| 2017/0219856 A1* | 8/2017 | Fu .......................... G02F 1/035 |
| | | 385/2 |

FOREIGN PATENT DOCUMENTS

| KR | 1020120061129 | 6/2012 |
| KR | 1020140068421 | 6/2014 |

OTHER PUBLICATIONS

Office Action from the European Patent Office dated Apr. 25, 2018 in corresponding European Application No. 17 174 637.3.

* cited by examiner

DISPLAY APPARATUS

CROSS-REFERENCE TO REPLATED APPLICATION

This application claims priority under 35 U.S.C. § 119 to Korean Patent Application No. 10-2016-0071308, filed on Jun. 8, 2016, the disclosure of which is incorporated by reference in its entirety herein.

BACKGROUND

1. Technical Field

Exemplary embodiments of the inventive concept relate to a display apparatus.

2. Discussion of Related Art

A cathode ray tube (CRT) display apparatus contains one or more electron guns and a phosphorescent screen, and is used to display image. However the CRT display apparatus typically has a large size and is heavy. Accordingly, a CRT display apparatus is not very portable. Flat panel display apparatuses such as a plasma display apparatus, a liquid crystal display apparatus and an organic light emitting diode display apparatus have a small size, a light weight and a low-power-consumption.

The flat panel display apparatus includes a display area in which an image is displayed, and a peripheral area surrounding the display area in which a driving part is disposed. Signal lines which receive signals from the driving part in the peripheral area have a fan-out shape configured to provide the signals to the display area. A size of the peripheral area may be determined by a structure of the fan-out shape. However, the fan-out shape may cause a deviation in the signals. Thus, there is a need for a display apparatus that reduces or eliminates this deviation.

SUMMARY

At least one exemplary embodiment of the inventive concept provides a display apparatus with an improved arrangement of its fan-out lines, which enables the peripheral area of its non-display area to be reduced in size.

According to an exemplary embodiment of the inventive concept, a display apparatus includes at least one pixel disposed in a display area, and a driving circuit disposed in a peripheral area adjacent the display area. The driving circuit is for driving the at least one pixel to display an image. The peripheral area includes a first fan-out area and a second fan-out area disposed between the first fan-out area and the display area. The display apparatus further include a first fan-out line disposed in the first fan-out area and the second fan-out area, and fanned out from the first fan-out area to the display area, a second fan-out line disposed in the second fan-out area, and fanned out from the second fan-out area to the display area, a first horizontal power line disposed in the second fan-out area, and a second horizontal power line disposed in the first fan-out area, and electrically connected to the second fan-out line.

In an exemplary embodiment, the second fan-out line is overlapped with the first horizontal power line in the second fan-out area.

In an exemplary embodiment, the display apparatus further includes a first insulation layer disposed between the second fan-out line and the first horizontal power line to insulate the second fan-out line and the first power horizontal line from each other.

In an exemplary embodiment, the first fan-out line and the second fan-out line are formed from a same layer.

In an exemplary embodiment, the first horizontal power line and the second horizontal power line are formed from a same layer.

In an exemplary embodiment, the second horizontal power line is connected to the second fan-out line through a first contact hole formed through the first insulation layer.

In an exemplary embodiment, the display apparatus further includes a first power line disposed in the display area, electrically connected to the first horizontal power line and extending in a direction which is perpendicular to the first horizontal power line, and a second power line disposed in the display area, electrically connected to the second power horizontal line and extending in a direction which is perpendicular to the second horizontal power line.

In an exemplary embodiment, the second power line is connected to the second fan-out line through a second contact hole formed through the first insulation layer.

In an exemplary embodiment, the first power line extends from the first horizontal power line.

In an exemplary embodiment, the display apparatus further includes a vertical data line electrically connected to the at least one pixel, a first vertical power line and a second vertical power line. The vertical data line may be connected to the first fan-out line. The first vertical power line may be connected to the first horizontal power line. The second power line may be electrically connected to the second horizontal power line.

In an exemplary embodiment, the first vertical power line, the second vertical power line, the first horizontal power line and the second horizontal power line are formed from a same layer.

In an exemplary embodiment, each pixel of the at least one pixel includes a driving transistor and a pixel electrode connected to the driving transistor. The pixel electrode, the first horizontal power line and the second horizontal power line may be formed from a same layer.

In an exemplary embodiment, the display apparatus further includes a second insulation layer disposed on the first horizontal power line and the second horizontal power line.

In an exemplary embodiment, the second horizontal power line includes a first horizontal line and a second horizontal line spaced apart from the first horizontal line. The first horizontal line may further include a connecting portion that protrudes from the first horizontal line. The connecting portion may be disposed between the first horizontal line and the second horizontal line.

In an exemplary embodiment, a plurality of first fan-out lines and second fan-out lines are present that alternate with each other in the second fan-out area.

In an exemplary embodiment, an angle between the first fan-out line and the horizontal power lines in the first fan-out area is different from and an angle between the first fan-out line and the horizontal power lines in the second fan-out area.

According to an exemplary embodiment of the inventive concept, a display apparatus includes at least one pixel disposed in a display area, a driving circuit disposed in a peripheral area to generate signal for driving the at least one pixel to display an image, wherein the peripheral area is disposed adjacent the display area, a plurality of first fan-out lines disposed in the peripheral area and extended from the driving circuit and fanned out to the display area, a plurality of second fan-out lines disposed in the peripheral area to alternate with the first fan-out lines, a first horizontal power line overlapping the second fan-out line, and a second horizontal power line spaced apart from the first power horizontal line and electrically connected to the second fan-out line, and overlapping the first fan-out line.

In an exemplary embodiment, the display apparatus further includes a first insulation layer disposed between the first horizontal power line and the first fan-out line. The second power horizontal line may be connected to the second fan-out line through a first contact hole formed through the first insulation layer.

In an exemplary embodiment, a length of the first fan-out line in a direction is longer than a length of the second fan-out line of the same direction. The direction may be perpendicular to the direction of the horizontal power lines.

According to an exemplary embodiment of the inventive concept, a display apparatus includes a pixel disposed in a display area, and a driving circuit disposed in a peripheral area adjacent the display area. The driving circuit is for driving the pixel to display an image. The peripheral area includes a first fan-out area and a second fan-out area disposed between the first fan-out area and the display area. The display apparatus further includes a first fan-out line disposed in the first fan-out area and the second fan-out area to provide a power supply voltage from the driving circuit to the pixel, a second fan-out line extending from the pixel to a hole in the first fan-out area to provide a data signal from the driving circuit to the pixel, a first horizontal power line disposed in the second fan-out area, and a second horizontal power line disposed in the first fan-out area, and electrically connected to the second fan-out line.

In an embodiment, the second fan-out line is overlapped with the first horizontal power line in the second fan-out area.

BRIEF DESCRIPTION OF THE DRAWINGS

The inventive concept will become more apparent by describing in detail exemplary embodiments thereof with reference to the accompanying drawings, in which.

DETAILED DESCRIPTION

Hereinafter, exemplary embodiments of the inventive concept will be explained in detail with reference to the accompanying drawings. As used herein, the singular forms, "a," "an" and "the" are intended to include the plural forms as well, unless the context clearly indicates otherwise.

Figure 1:
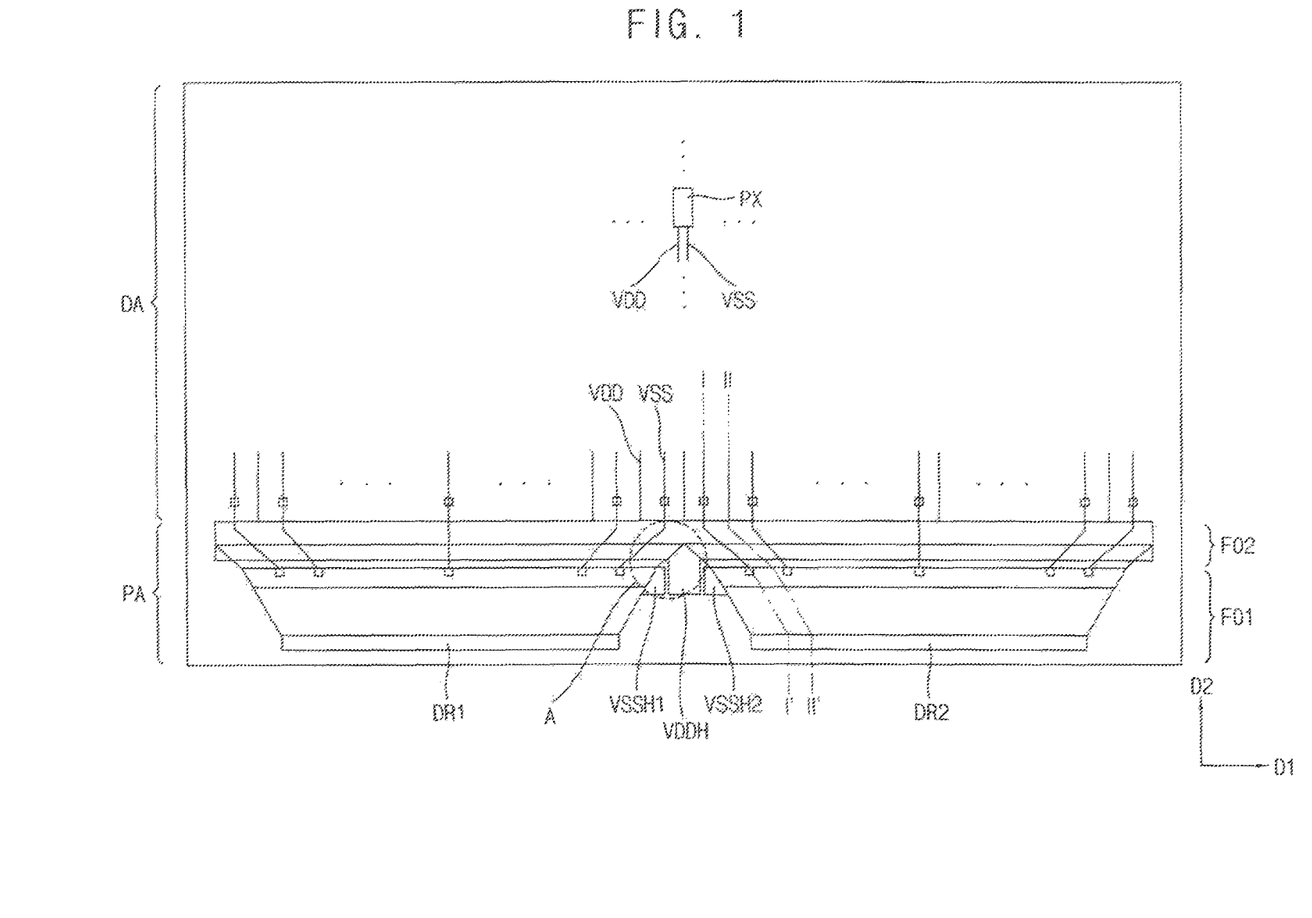
FIG. 1 is a plan view illustrating a display apparatus according to an exemplary embodiment of the inventive concept.
Figure 2:
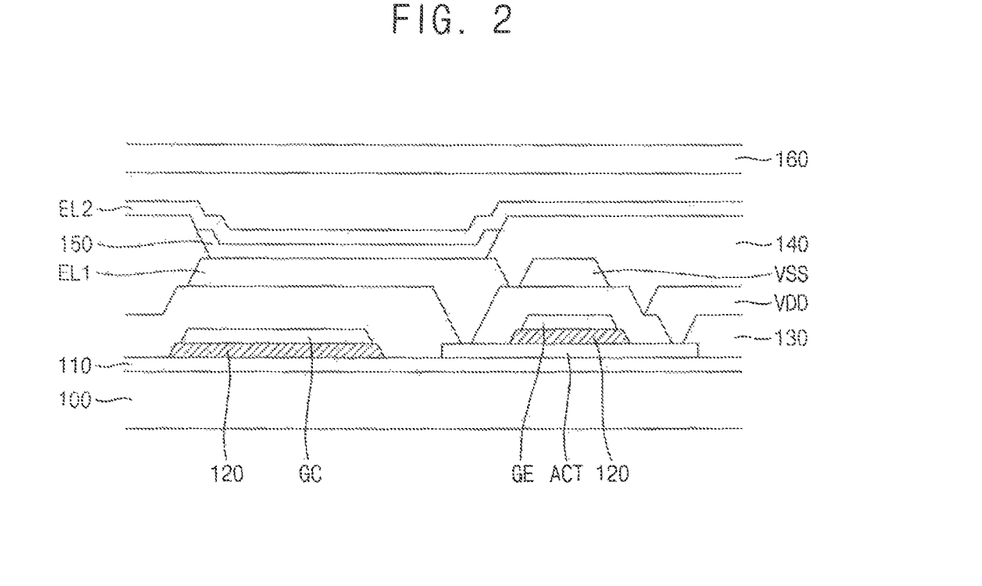
FIG. 2 is a cross-sectional view illustrating a pixel of the display apparatus of FIG. 1.
Figure 3:
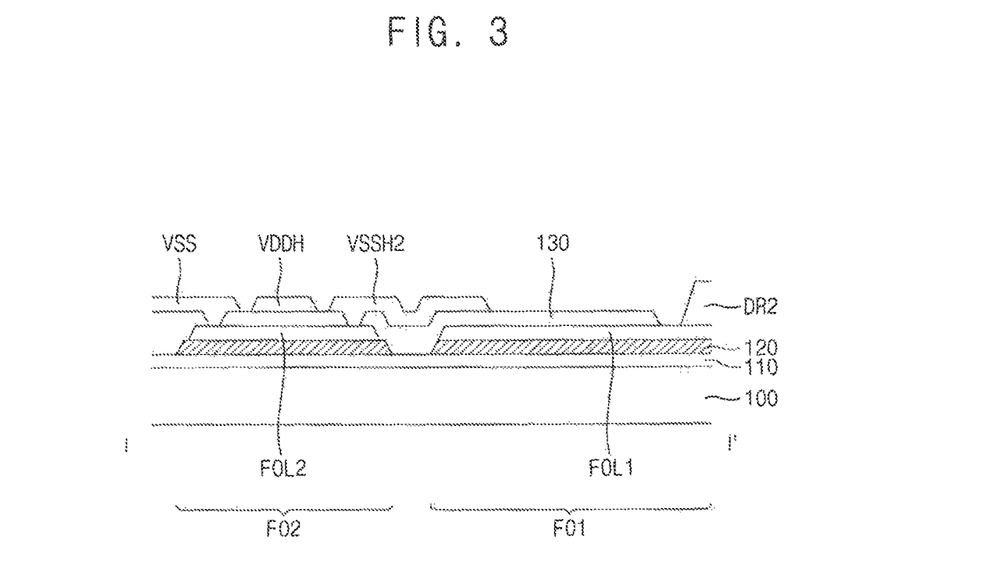
FIG. 3 is a cross-sectional view taken along a line I-I' of FIG. 1.

FIG. 1 is a plan view illustrating a display apparatus according to an exemplary embodiment of the inventive concept. FIG. 2 is a cross-sectional view illustrating a pixel of the display apparatus of FIG. 1. FIG. 3 is a cross-sectional view taken along a line I-I' of FIG. 1.

Figure 4:
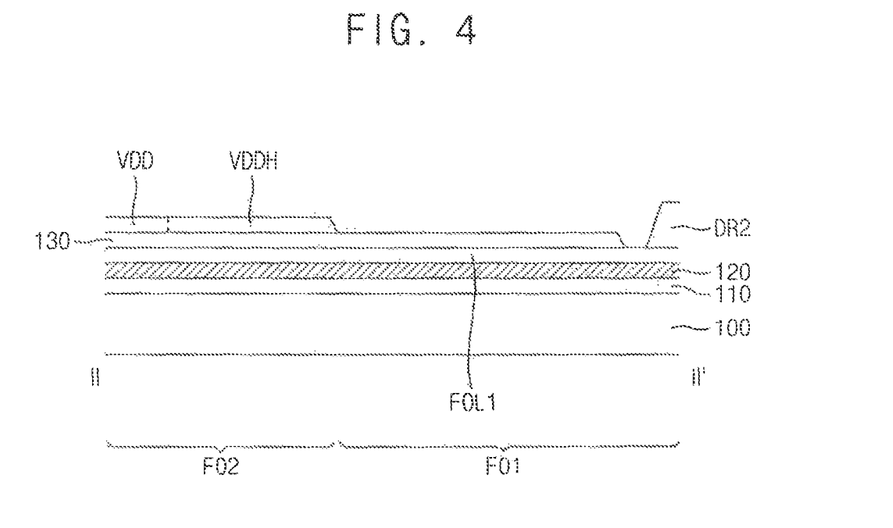
FIG. 4 is a cross-sectional view taken along a line II-II' of FIG. 1.
Figure 5:
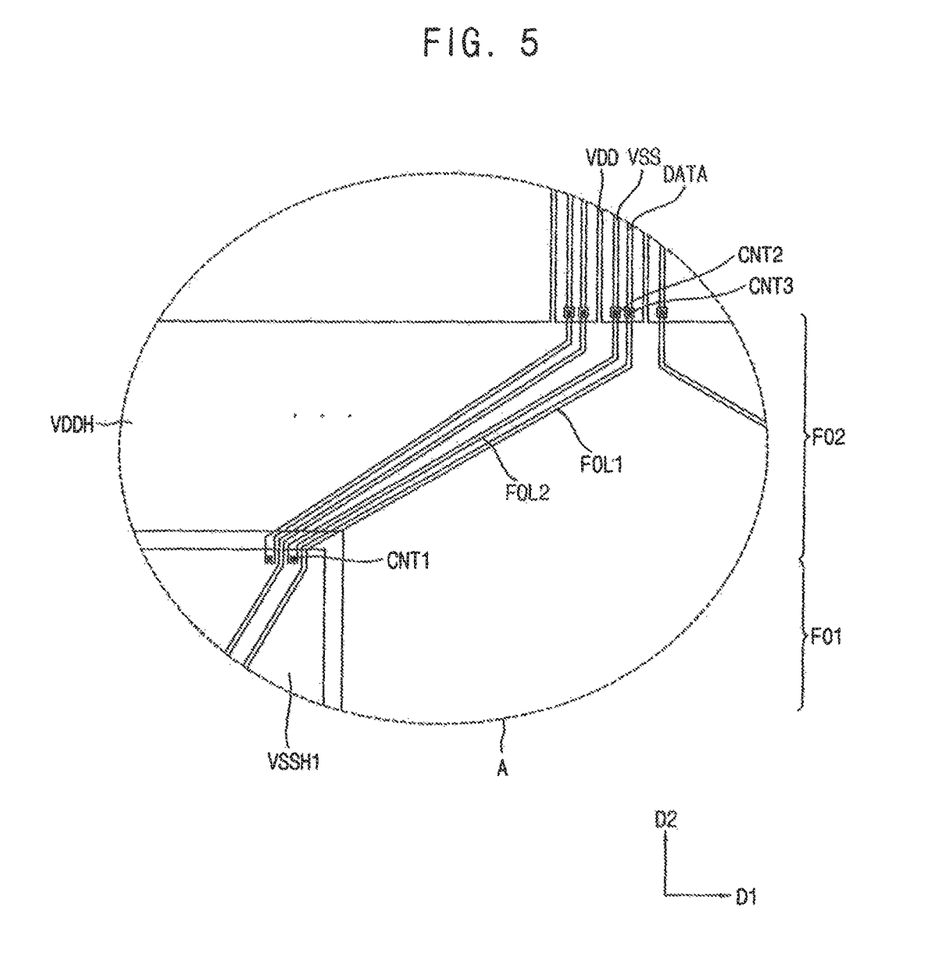
FIG. 5 is an enlarged view of 'A' area of FIG. 1.

FIG. 4 is a cross-sectional view taken along a line II-II' of FIG. 1. FIG. 5 is an enlarged view of 'A' area of FIG. 1.

Referring to FIGS. 1 to 5, the display apparatus includes a display area DA in which an image is displayed and a peripheral area PA which extends in a first direction D1 and is disposed adjacent to the display area DA in a second direction D2. The second direction D2 may be substantially perpendicular to the first direction D1.

A plurality of pixels PX to display the image and signal lines electrically connected to the pixels PX are disposed on the display area DA. The signal lines extend in the second direction D2 and include a first power line VDD, a second power line VSS and a data line DATA. The pixels PX may be arranged in a matrix form.

Although one data line is connected to one pixel in FIG. 5, the data line may include a plurality of signal lines which transfer various signals as required. For example, the data line may include at least one of a sensor signal line, a red data signal line, a green data signal line, a blue data signal line, and a white data signal line. Further, the signal lines may be arranged in the first direction in parallel with each other.

A driving part (e.g., driving circuit) configured to drive the pixel PX in the display area DA is disposed in the peripheral area PA.

In an embodiment, a first driving part DR1 (e.g., a first driving circuit), a second driving part DR2 (e.g., a second driving circuit), a horizontal high power line VDDH, a first horizontal low power line VSSH1, a second horizontal low power line VSSH2, a first fan-out line FOL1 and a second fan-out line FOL2 are disposed in the peripheral area PA.

In an embodiment, the first driving part DR1 and the second driving part DR2 provide a data signal to the data line DATA. In an embodiment, the first and second driving parts DR1 and DR2 additionally provide a first voltage to the horizontal high power line VDDH, and provide a second voltage to the first horizontal low power line VSSH1 and the second horizontal low power line VSSH2. In an embodiment, each of the first and second driving parts DR1 and DR2 is a tape carrier package having an integrated circuit (IC) chip connected to the display apparatus. In an embodiment, each of the first and second driving parts DR1 and DR2 is directly mounted on the base substrate 100.

While the driving part is shown in FIG. 1 as being divided into the first and second driving parts DR1 and DR2, the inventive concept is not limited thereto. For example, in exemplary embodiments, the driving part is a single device or includes more than two driving parts. In an exemplary embodiment, a first voltage applied to the first power line VDD is a driving voltage of an organic light emitting diode (OLED) and a second voltage applied to the second power line VSS is a ground voltage. In an alternate embodiment, the first voltage applied to the first power line VDD is the ground voltage, and the second voltage applied to the second power line VSS is the driving voltage. In an embodiment, the ground voltage is lower than the driving voltage.

The first fan-out line FOL1 is electrically connected to the first or second driving part DR1 or DR2, and is disposed in the first fan-out area FO1 and the second fan-out area FO2 of the peripheral area PA. Thus, the first fan-out line FOL1 extends from the first or second driving part DR1 or DR2 through the first fan-out area FO1 and the second fan-out area FO2 to the data line DATA in the display area DA, so that the first fan-out line FOL1 is electrically connected to the data line DATA.

The first fan-out line FOL1 may be fanned out from the first or second driving part DR1 or DR2 through the first and second fan-out areas FO1, FO2 to the end of the signal lines in the display area DA. In an embodiment, a fan-out amount of the first fan-out line FOL1 in the first fan-out area FO1 is different from a fan-out amount of the first fan-out line FOL1 in the second fan-out area FO2. In an embodiment, a fan-out amount in the second fan-out area FO2 is greater than a fan-out amount in the first fan-out area FO1. Thus, in an exemplary embodiment, an angle between the first fan-out line FOL1 and the first direction D1 in the first fan-out area FO1 is larger than an angle between the first fan-out line FOL1 and the first direction D1 in the second fan-out area FO2.

The horizontal high power line VDDH may extend in the first direction D1. The first voltage is applied to the horizontal high power line VDDH. In an embodiment, the horizontal high power line VDDH is disposed in the second fan-out area FO2. In an embodiment, the horizontal high power line VDDH overlaps the second fan-out line FOL2.

Each of a plurality of first power lines VDD may extend from the horizontal high power line VDDH along the second direction D2. Accordingly, the first voltage is applied to the pixel PX through the horizontal high power line VDDH and the first power line VDD. In an embodiment, a width of the horizontal high power line VDDH is wide enough so that the first voltage is evenly provided to a plurality of first power lines VDD along the first direction D1.

The first horizontal low power line VSSH1 may extend in the first direction D1, and may be spaced apart from the horizontal high power line VDDH in the second direction D2. In an embodiment, the first horizontal low power line VSSH1 is electrically connected to the second fan-out line FOL2. The second horizontal low power line VSSH2 may extend in the first direction D1, and may be spaced apart from the horizontal high power line VDDH in the second direction D2. The second horizontal low power line VSSH2 may be spaced apart from the first horizontal low power line VSSH1 in the first direction D1. In an embodiment, the second horizontal low power line VSSH2 is electrically connected to the second fan-out line FOL2.

The second voltage may be applied to the pixel PX through the first horizontal low power line VSSH1 or the second horizontal low power line VSSH2, the second fan-out line FOL2 and the second power line VSS. In an exemplary embodiment, each of the second fan-out lines FOL2 have the same resistance, so that the second voltage is evenly provided to a plurality of the second power lines VSS along the first direction D1.

The horizontal high power line VDDH may be disposed between the first horizontal low power line VSSH1 and the second horizontal low power line VSSH2. In an embodiment, the horizontal high power line VDDH further includes a connecting portion that protrudes from the horizontal high power line VDDH. In this embodiment, the first voltage is applied to the connecting portion. In an embodiment, the connecting portion is a conductor.

The second fan-out line FOL2 may be fanned out along the second direction D2 in the second fan-out area FO2. In an embodiment, the second fan-out line FOL2 is disposed between a plurality of first fan-out lines FOL1 adjacent to each other in the second fan-out area FO2. In an embodiment, a gap between the first fan-out lines FOL1 disposed adjacent to each other in the second fan-out area FO2 is greater than a gap in the first fan-out area FO1, so that there is enough space to dispose the second fan-out line FOL2.

Accordingly, deviation of the first voltage and deviation of the second voltage according to position in the first direction D1 may be reduced.

In an embodiment, the first and second horizontal low power lines VSSH1 and VSSH2 are connected to the second power line VSS through the second fan-out line FOL2. In an embodiment, the horizontal high power line VDDH overlaps the second fan-out line FOL2 in the second fan-out area FO2. Thus, the first horizontal low power line VSSH1, the second horizontal low power line VSSH2 and the horizontal high power line VDDH overlap with the first and second fan-out lines FOL1 and FOL2 in the peripheral area PA, so that the size of the peripheral area PA may be minimized. Thus, an area where the first horizontal low power line VSSH1, the second horizontal low power line VSSH2 and the horizontal high power line VDDH do not overlap the fan-out lines may be minimized, so that the peripheral area PA which is a non-display area may be minimized.

Referring to FIG. 2, in the display area DA, the display apparatus includes a base substrate 100, a buffer layer 110, an active pattern ACT, a gate insulation layer 120, a gate pattern, a first insulation layer 130, source-drain-pixel pattern, a pixel defining layer 140, a light emitting structure 150, an opposite electrode EL2 and a sealing substrate 160.

The base substrate 100 may include a transparent insulation substrate. For example, the base substrate 100 may include a glass substrate, a quartz substrate, a transparent resin substrate, etc.

The buffer layer 110 is disposed on the base substrate 100. The buffer layer 110 may prevent diffusion of metal atoms and/or impurities from the base substrate 100. Additionally, the buffer layer 110 may adjust a heat transfer rate of a successive crystallization process for the active pattern ACT so that the active patter ACT is substantially uniform. If the base substrate 100 has a relatively irregular surface, the buffer layer 110 may improve flatness of the surface of the base substrate 100.

The active pattern ACT is disposed on the buffer layer 110. The active pattern ACT may include a source and drain area which is an impurity-doped area, and a channel area between the source area and the drain area.

The gate insulation layer 120 is disposed on the buffer layer 110 on which the active pattern ACT is disposed. The gate insulation layer 120 may include a silicon compound, metal oxide, etc. In an exemplary embodiment, the gate insulation layer 120 is uniformly formed on the buffer layer 110 along a profile of the active pattern ACT. In an exemplary embodiment, the gate insulation layer 120 has a relatively large thickness for sufficiently covering the active pattern ACT, so that the gate insulation layer 120 may have a substantially level surface.

The gate pattern is disposed on the gate insulation layer 120. The gate pattern includes a gate electrode GE overlapping the active pattern ACT, a first capacitor electrode GC, first and second fan-out lines (refers to FOL1 and FOL2 of FIG. 5) and a signal line (e.g., a gate line) for transmitting a driving signal. In an embodiment, the gate electrode GE, the first capacitor electrode GC and the first and second fan-out lines are formed from a same layer.

The first insulation layer 130 is disposed on the gate insulation layer 120 on which the gate pattern is disposed. In an exemplary embodiment, the first insulation layer 130 has a relatively large thickness for sufficiently covering the gate pattern, so that the first insulation layer 130 may have a substantially level surface. In an exemplary embodiment, the first insulation layer 130 is uniformly formed on the gate insulation layer 120 along a profile of the gate pattern.

The source-drain-pixel pattern may be formed on the first insulation layer 130. In an embodiment, the source-drain-pixel pattern includes a source electrode, a drain electrode, the first power line VDD, the second power line VSS and a pixel electrode EL1. In an embodiment, the source electrode, the drain electrode, the first power line VDD, the second power line VSS and the pixel electrode EL1 are formed from a same layer.

The source and drain electrode may be electrically connected to the active pattern ACT through contact holes formed through the first insulation layer 130. The pixel electrode EL1 may be electrically connected to the active pattern ACT through a contact hole formed through the first insulation layer 130.

In an embodiment, the active pattern ACT, the gate electrode GE, the source electrode and the drain electrode are included in a driving transistor.

The pixel defining layer 140 may be disposed on the first insulation layer 130 on which the source-drain-pixel pattern is formed. The pixel defining layer 140 may include one more openings exposing the pixel electrode EL1.

In an embodiment, the light emitting structure 150 is located on a part of the pixel electrode EL1 exposed by an opening of the pixel defining layer 140. The light emitting structure 150 may extend along a sidewall of the opening of the pixel defining layer 140. In an exemplary embodiment, the light emitting structure 150 includes a plurality of organic light emitting layers such as an emission layer (EML), a hole injection layer (HIL), a hole transport layer (HTL), an electron transport layer (ETL), and an electron injection layer (EIL). In an exemplary embodiment, the plurality of organic light emitting layers may be formed using light emitting materials for generating different colors of light such as a red color of light, a green color of light and a blue color of light in accordance with color pixels of the display apparatus. In an exemplary embodiment, the organic light emitting layer of the light emitting structure 150 includes a plurality of stacked light emitting materials for generating a red color of light, a green color of light, a blue color of light, or a white color of light. In an embodiment where the white color of light is generated, the display apparatus may further include color filter layer to form various colors (e.g., red, green, blue, etc.) of light from the white color of light.

The opposite electrode EL2 is disposed on the pixel defining layer 140 and the light emitting structure 150. The opposite electrode EL2 may include a transmissive material when the display apparatus is a front emission type.

The sealing substrate 160 is disposed on the opposite electrode EL2. The sealing substrate 160 may include a glass substrate, a quartz substrate, a transparent resin substrate, etc. In an exemplary embodiment, a predetermined space is provided between the opposite electrode EL2 and the sealing substrate 160. This space may be filled with an air or an inactive gas such as a nitrogen (N2) gas. In an exemplary embodiment, a thin film encapsulation layer (not illustrated) is additionally disposed between the opposite electrode EL2 and the sealing substrate 160. In an embodiment, the thin film encapsulation layer entirely covers the base substrate 100. In an exemplary embodiment, the thin film encapsulation layer covers a portion of the base substrate 100. The thin film encapsulation layer may include an inorganic film such as silicon oxide or silicon nitride film and an organic film such as epoxy or polyimide film, which are alternately and repeatedly formed. However, exemplary embodiments of thin film encapsulation layer are not limited thereto. For example, another transparent thin film for seal g may be applied. In addition, the stacking order of the inorganic film and the organic film may be changed if necessary.

Referring to FIGS. 3 and 5, in a cross-sectional view of a circuit along which the second voltage is applied, the display apparatus includes the base substrate 100, the buffer layer 110, the gate insulation layer 120, the first fan-out line FOL1, the second fan-out line FOL2, the first insulation layer 130, the horizontal high power line VDDH, the first power line VDD, and the second driving part DR2.

The buffer layer 110 is disposed on the base substrate 100. The gate insulation layer 120 is disposed on the buffer layer 110. The first fan-out line FOL1 and the second fan-out line FOL2 are disposed on the gate insulation layer 120. The first insulation layer 130 is disposed on the gate insulation layer 120 on which the first and second fan-out lines FOL1 and FOL2 are disposed. The second horizontal low power line VSSH2, the horizontal high power line VDDH and the second power line VSS are disposed on the first insulation layer 130. The second driving part DR2 is electrically connected to the first fan-out line FOL1, which is exposed by the first insulation layer 130.

In an embodiment, the source-drain-pixel pattern includes the second horizontal low power line VSSH2, the horizontal high power line VDDH and the second power line VSS. In an embodiment, the second horizontal low power line VSSH2, the horizontal high power line VDDH and the second power line VSS are formed from a same layer.

In an embodiment, the second horizontal low power line VSSH2 is electrically connected to the second fan-out line FOL2 through a first contact hole CNT1 formed through the first insulation layer 130. The second fan-out line FOL2 and the horizontal high power line VDDH may be insulated by the first insulation layer 130 which is disposed therebetween. In an embodiment, the second fan-out line FOL2 is electrically connected to the second power line VSS through a second contact hole CNT2 formed through the first insulation layer 130.

In addition, the first fan-out line FOL1 may be electrically connected to the data line DATA through a third contact hole CNT3 formed through the first insulation layer 130.

Referring to FIGS. 4 and 5, in a cross-sectional view of a circuit along which the first voltage is applied, the display apparatus includes the base substrate 100, the buffer layer 110, the gate insulation layer 120, the first fan-out line FOL1, the first insulation layer 130, the horizontal high power line VDDH, the first power line VDD, and the second driving part DR2.

The buffer layer 110 is disposed on the base substrate 100. The gate insulation layer 120 is disposed on the buffer layer 110. The first fan-out line FOL1 is disposed on the gate insulation layer 120. The first insulation layer 130 is disposed on the gate insulation layer 120 on which the first fan-out line FOL1 is disposed. The horizontal high power line VDDH and the first power line VDD are disposed on the first insulation layer 130. The second driving part DR2 is electrically connected to the first fan-out line FOL1, which is exposed by the first insulation layer 130.

The horizontal high power line VDDH is electrically connected to the first power line VDD. The horizontal high power line VDDH and the first power line VDD may be included in the source-drain-pixel pattern, and these may be formed from a same layer.

In FIG. 5, the first fan-out line FOL1 is located in the first fan-out area FO1 and the second fan-out area FO2, while the second fan-out line FOL2 is only located in the second fan-out area FO2. In an embodiment, the second fan-out line FOL2 is able to avoid passing through the first fan-out area FO1 by passing through first contact hole CNT1 formed through the first insulation layer 130. In an embodiment, the length of the first fan-out line FOL1 in the second direction D2 is longer than the length of the second fan-out line FOL2 in the second direction D2. For example, as shown in FIG. 5, in an embodiment, the portion of the first fan-out line FOL1 between the diagonal portion of the first fan-out line FOL1 and the data line DATA is longer than the portion of the second fan-out line FOL2 between the diagonal portion of the second fan-out line FOL2 and the second power line VSS.

Figure 6:
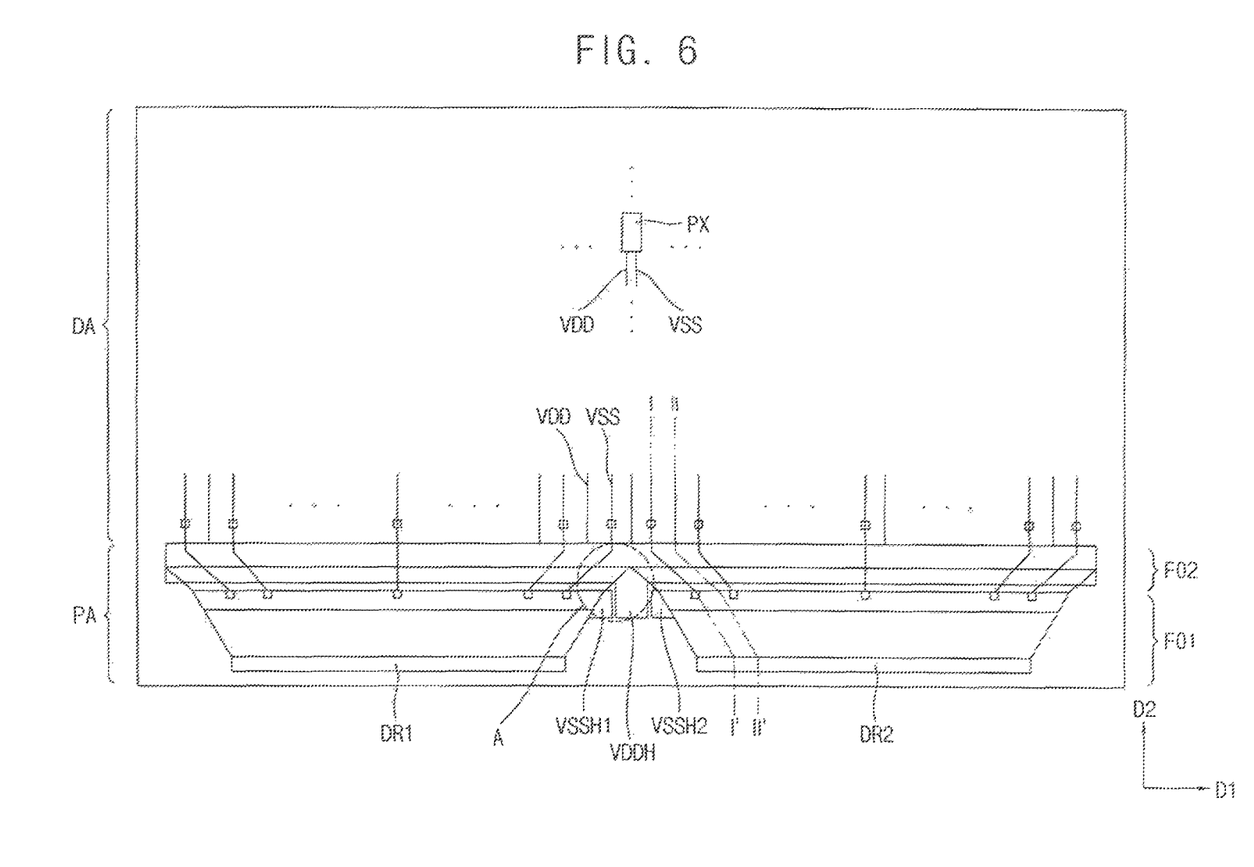
FIG. 6 is a plan view illustrating a display apparatus according to an exemplary embodiment of the inventive concept.
Figure 7:
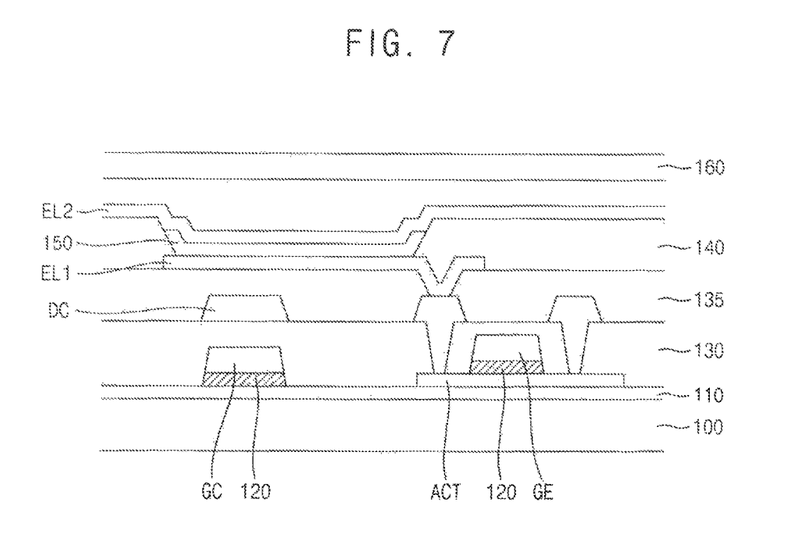
FIG. 7 is a cross-sectional view illustrating a pixel of the display apparatus of FIG. 6.
Figure 8:
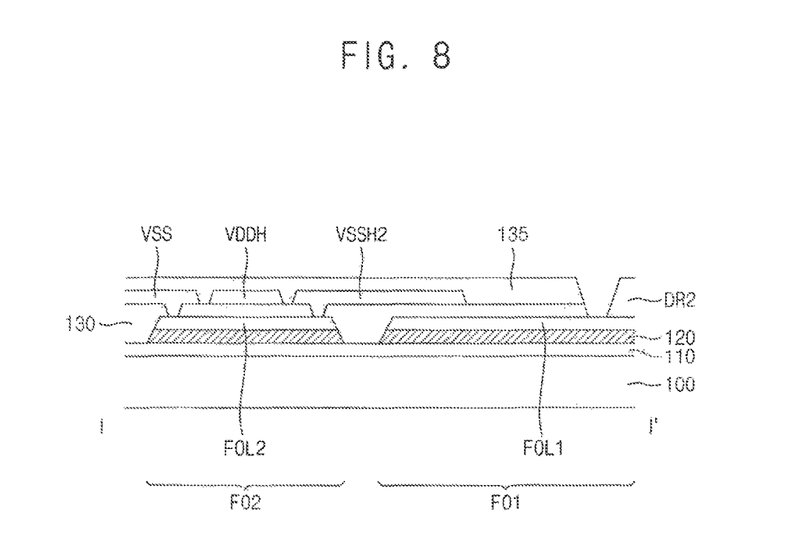
FIG. 8 is a cross-sectional view taken along a line I-I' of FIG. 6.
Figure 9:
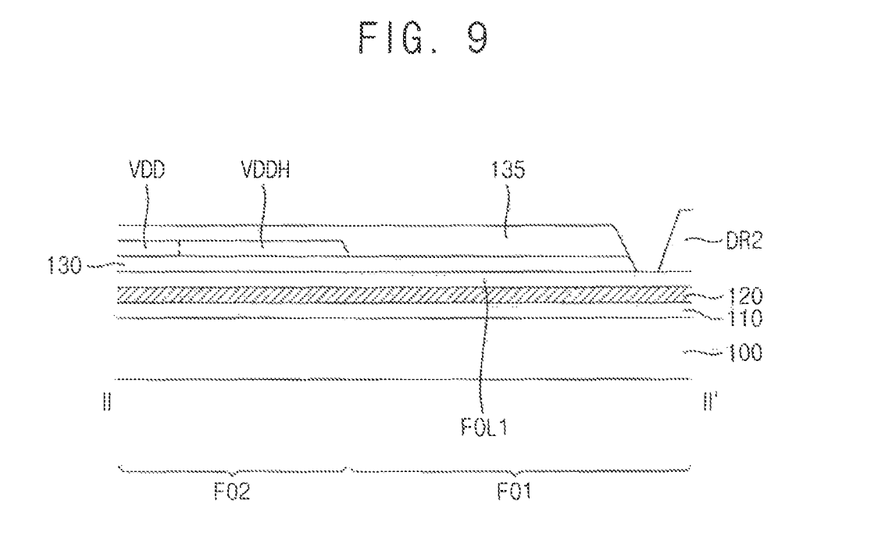
FIG. 9 is a cross-sectional view taken along a line II-II' of FIG. 6.
Figure 10:
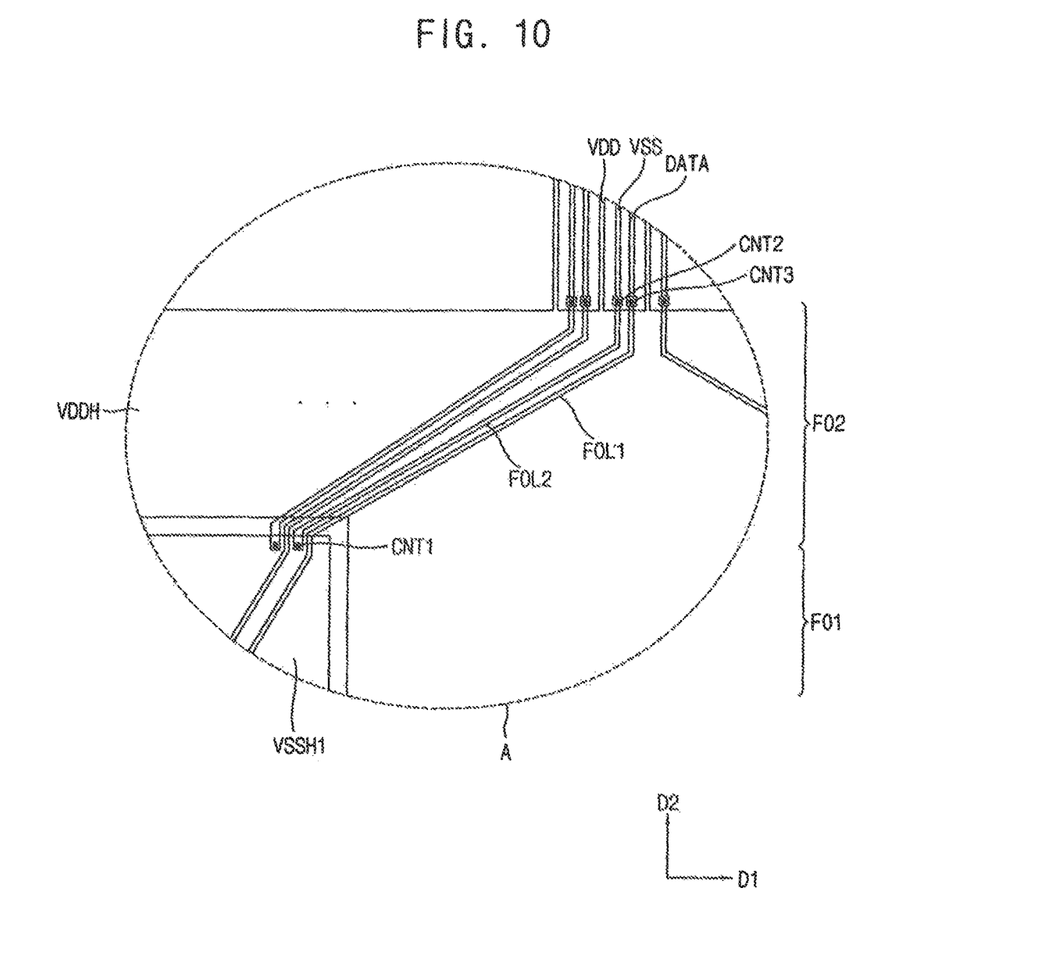
FIG. 10 is an enlarged view of 'A' area of FIG. 6.

FIG. 6 is a plan view illustrating a display apparatus according to an exemplary embodiment of the inventive concept. FIG. 7 is a cross-sectional view illustrating a pixel of the display apparatus of FIG. 6. FIG. 8 is a cross-sectional view taken along a line I-I' of FIG. 6. FIG. 9 is a cross-sectional view taken along a line II-II' of FIG. 6. FIG. 10 is an enlarged view of 'A' area of FIG. 6.

Referring to FIGS. 6 to 10, the display apparatus is substantially same as the display apparatus of FIGS. 1 to 5, except for a second insulation layer 135, a source-data pattern, and a pixel electrode EL1. Thus, any further detailed descriptions concerning the same elements will be omitted or be briefly described.

The display apparatus includes a display area DA in which an image is displayed and a peripheral area PA which extends in a first direction D1 and is disposed adjacent to the display area DA in a second direction D2.

A plurality of pixels PX to display the image and signal lines electrically connected to the pixels PX are disposed on the display area DA. The signal lines may include a first power line VDD, a second power line VSS and a data line DATA.

In an embodiment, a first driving part DR1, a second driving part DR2, a horizontal high power line VDDH, a first horizontal low power line VSSH1, a second horizontal low power line VSSH2, a first fan-out line FOL1 and a second fan-out line FOL2 are disposed in the peripheral area PA.

Referring to FIG. 7, in the display area DA, the display apparatus includes a base substrate 100, a buffer layer 110, an active pattern ACT, a gate insulation layer 120, a gate pattern, a first insulation layer 130, source-drain pattern, a second insulation layer 135, a pixel electrode EL1, a pixel defining layer 140, a light emitting structure 150, an opposite electrode EL2 and a sealing substrate 160.

The buffer layer 110 is disposed on the base substrate 100. The active pattern ACT is disposed on the buffer layer 110. The gate insulation layer 120 is disposed on the buffer layer 110 on which the active pattern ACT is disposed.

The gate pattern includes a gate electrode GE overlapping the active pattern ACT, a first capacitor electrode GC, first and second fan-out lines (refers to FOL1 and FOL2 of FIG. 10) and a signal line (e.g., a gate line) for transmitting a driving signal such as a gate signal.

The first insulation layer 130 is disposed on the gate insulation layer 120 on which the gate pattern is disposed.

The source-drain pattern may be disposed on the first insulation layer 130. In an embodiment, the source-drain pattern includes a source electrode, a drain electrode, the first power line VDD and the second power line VSS.

The second insulation layer 135 is disposed on the first insulation layer 130 on which the source-drain pattern is formed. The second insulation layer 135 may have a single-layered structure or a multi-layered structure including at least two insulation films. The second insulation layer 135 may be formed using an organic material or an inorganic material.

The pixel electrode EL1 is disposed on the second insulation layer 135. The pixel electrode EL1 may be electrically connected to the drain electrode through a contact hole formed through the second insulation layer 135.

The pixel electrode EL1 is disposed on the second insulation layer 135 on which the source-drain pattern is formed. The light emitting structure 150 is located on a part of the pixel electrode EL1 exposed by the opening of the pixel defining layer 140. The opposite electrode EL2 is disposed on the pixel defining layer 140 and the light emitting structure 150. The sealing substrate 160 may be disposed on the opposite electrode EL2.

Referring to FIGS. 8 and 10, in a cross-sectional view of a circuit along which the second voltage is applied, the display apparatus includes the base substrate 100, the buffer layer 110, the gate insulation layer 120, the first fan-out line FOL1, the second fan-out line FOL2, the first insulation layer 130, the horizontal high power line VDDH, the first power line VDD, the second insulation layer 135 and the second driving part DR2.

The buffer layer 110 is disposed on the base substrate 100. The gate insulation layer 120 is disposed on the buffer layer 110. The first fan-out line FOL1 and the second fan-out line FOL2 are disposed on the gate insulation layer 120. The first insulation layer 130 is disposed on the gate insulation layer 120 on which the first and second fan-out lines FOL1 and FOL2 are disposed. The second horizontal low power line VSSH2, the horizontal high line VDDH and the second power line VSS are disposed on the first insulation layer 130. The second horizontal low power line VSSH2 and the horizontal high power line VDDH may be included in the source-drain pattern, and these may be formed from a same layer.

In an embodiment, the second horizontal low power line VSSH2 is electrically connected to the second fan-out line FOL2 through a first contact hole CNT1 formed through the first insulation layer 130. In an embodiment, the second fan-out line FOL2 is electrically connected to the second power line VSS through a second contact hole CNT2 formed through the first insulation layer 130.

Referring to FIGS. 9 and 10, in a cross-sectional view of a circuit along which the first voltage is applied, the display apparatus includes the base substrate 100, the buffer layer 110, the gate insulation layer 120, the first fan-out line FOL1, the first insulation layer 130, the horizontal high power line VDDH, the first power line VDD, and the second driving part DR2.

The horizontal high power line VDDH and the first power line VDD may be included in the source-drain pattern, and these may be formed from a same layer.

According to an exemplary embodiment of the present inventive concept, a display apparatus includes a first fan-out line disposed in first and second fan-out areas, a second fan-out line only disposed in the second fan-out area, a first horizontal low power line disposed in the second fan-out area, and a second horizontal low power line disposed in the first fan-out area. The width of the first horizontal low power line is wide enough, so that a first voltage may be evenly applied to a plurality of the first power lines.

In addition, the second horizontal low power line is connected to the second fan-out line, and the first horizontal low power line is overlapped with the second fan-out line in the second fan-out area. Accordingly, the size of the peripheral area which is a non-display area may be minimized.

While the above describes an embodiment where the horizontal high power line VDDH provides a high voltage (e.g., a driving voltage), and each of the first horizontal low power line VSSH1 and the second horizontal low power line VSSH2 provide a low voltage (e.g., a ground voltage), the inventive concept is not limited thereto. For example, in an alternate embodiment, the horizontal high power line VDDH can be renamed as a horizontal low power line providing the low voltage and the first and second horizontal low power lines VSSH1 and VSSH2 can be renames as first and second horizontal high power lines providing the high voltage.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the inventive concept. Accordingly, all such modifications are intended to be included within the scope of the inventive concept.

What is claimed is:

1. A display apparatus, comprising:
    at least one pixel disposed in a display area;
    a driving circuit disposed in a peripheral area adjacent the display area, the driving circuit configured to drive the at least one pixel to display an image, output a first voltage, and output a second voltage different from the first voltage, the peripheral area further comprising a first fan-out area and a second fan-out area disposed between the first fan-out area and the display area;
    a first fan-out line disposed in the first fan-out area and the second fan-out area, and fanned out from the first fan-out area to the display area;
    a second fan-out line disposed in the second fan-out area, and fanned out from the second fan-out area to the display area;
    a first horizontal power line connected to the driving circuit to receive the first voltage and configured to provide the first voltage, wherein the first horizontal power line is disposed in the second fan-out area; and
    a second horizontal power line connected to the driving circuit to receive the second voltage and configured to provide the second voltage, wherein the second horizontal power line is disposed in the first fan-out area, and electrically connected to the second fan-out line.

2. The display apparatus of claim 1, wherein the second fan-out line is overlapped with the first horizontal power line in different layers in the second fan-out area.

3. The display apparatus of claim 2, further comprises a first insulation layer disposed between the second fan-out line and the first horizontal power line to insulate the second fan-out line and the first horizontal power line from each other.

4. The display apparatus of claim 3, wherein the first fan-out line and the second fan-out line are formed from a same layer.

5. The display apparatus of claim 4, wherein the first horizontal power line and the second horizontal power line are formed from a same layer.

6. The display apparatus of claim 5, wherein the second horizontal power line is connected to the second fan-out line through a contact hole formed through the first insulation layer.

7. The display apparatus of claim 5, further comprises:
    a first power line disposed in the display area, electrically connected to the first horizontal power line, and extending in a direction which is perpendicular to the first horizontal power line; and
    a second power line disposed in the display area, electrically connected to the second horizontal power line, and extending in a direction which is perpendicular to the second horizontal power line.

8. The display apparatus of claim 7, wherein the second power line is connected to the second fan-out line through a contact hole formed through the first insulation layer.

9. The display apparatus of claim 7, wherein the first power line extends from the first horizontal power line.

10. The display apparatus of claim 1, further comprising:
    a vertical data line electrically connected to the at least one pixel;
    a first vertical power line; and
    a second vertical power line;
    wherein the vertical data line is connected to the first fan-out line,
    wherein the first vertical power line is connected to the first horizontal power line, and
    wherein the second vertical power line is connected to the second horizontal power line.

11. The display apparatus of claim 10, wherein the first vertical power line, the second vertical power line, the first horizontal power line and the second horizontal power line are formed from a same layer.

12. The display apparatus of claim 10, wherein each pixel of the at least one pixel comprises a driving transistor and a pixel electrode connected to the driving transistor, and
    the pixel electrode, the first horizontal power line and the second horizontal power line are formed from a same layer.

13. The display apparatus of claim 1, further comprising an insulation layer disposed on the first horizontal power line and the second horizontal power line.

14. The display apparatus of claim 1, wherein the second horizontal power line comprises a first horizontal line and a second horizontal line spaced apart from the first horizontal line,
    wherein the first horizontal line further comprises a connecting portion that protrudes from the first horizontal line, and
    wherein the connecting portion is disposed between the first horizontal line and the second horizontal line.

15. The display apparatus of claim 1, wherein an angle between the first fan-out line and the horizontal power lines in the first fan-out area is different from an angle between the first fan-out line and the horizontal power lines in the second fan-out area.

16. A display apparatus, comprising:
    at least one pixel disposed in a display area;
    a driving circuit disposed in a peripheral area to generate a signal for driving the at least one pixel to display an image, the peripheral area disposed adjacent the display area;
    a plurality of first fan-out lines disposed in the peripheral area, extended from the driving circuit, and fanned out to the display area;
    a plurality of second fan-out lines disposed in the peripheral area to alternate with the first fan-out lines;
    a first horizontal power line overlapping the second fan-out line; and a second horizontal power line spaced apart from the first horizontal power line, electrically connected to the second fan-out line, and overlapping the first fan-out line.

17. The display apparatus of claim 16, further comprising a first insulation layer disposed between the first horizontal power line and the first fan-out line, wherein the second horizontal power line is connected to the second fan-out line through a first contact hole formed through the first insulation layer.

18. The display apparatus of claim 16, wherein a length of the first fan-out line in a direction is longer than a length of the second fan-out line in the same direction.

19. A display apparatus, comprising:

a pixel disposed in a display area, the pixel connected to a data line;

a driving circuit disposed in a peripheral area adjacent the display area, the driving circuit configured to drive the pixel to display an image, output a data voltage, and output a power supply voltage, the peripheral area further comprising a first fan-out area and a second fan-out area disposed between the first fan-out area and the display area;

a first fan-out line disposed in the first fan-out area and the second fan-out area, connected to the driving circuit to receive the data voltage, and configured to provide the data voltage from the driving circuit to the data line;

a second fan-out line extending from the pixel through the second fan-out area to a hole in the first fan-out area to connect to the driving circuit to receive the power supply voltage and provide the power supply voltage from the driving circuit to the pixel;

a first horizontal power line disposed in the second fan-out area; and a second horizontal power line disposed in the first fan-out area, and electrically connected to the second fan-out line, wherein the first fan-out line is adjacent the second fan-out line.

20. The display apparatus of claim 19, wherein the second fan-out line is overlapped with the first horizontal power line in different layers in the second fan-out area.

* * * * *